United States Patent
Zhai et al.

(10) Patent No.: US 10,156,621 B2
(45) Date of Patent: Dec. 18, 2018

(54) ADAPTIVE SPECIFIC ABSORPTION RATE (SAR) CONTROL FOR MAGNETIC RESONANCE IMAGING

(71) Applicant: KONINKLIJKE PHILIPS N.V., Eindhoven (NL)

(72) Inventors: Zhiyong Zhai, Solon, OH (US); Michael Andrew Morich, Mentor, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 881 days.

(21) Appl. No.: 14/436,547

(22) PCT Filed: Sep. 17, 2013

(86) PCT No.: PCT/IB2013/058587
§ 371 (c)(1),
(2) Date: Apr. 17, 2015

(87) PCT Pub. No.: WO2014/064553
PCT Pub. Date: May 1, 2014

(65) Prior Publication Data
US 2015/0268321 A1    Sep. 24, 2015

Related U.S. Application Data

(60) Provisional application No. 61/717,164, filed on Oct. 23, 2012.

(51) Int. Cl.
*G01R 33/54* (2006.01)
*G01R 33/28* (2006.01)
(Continued)

(52) U.S. Cl.
CPC ......... *G01R 33/543* (2013.01); *G01R 33/288* (2013.01); *G01R 33/443* (2013.01); *G01R 33/583* (2013.01); *G01R 33/586* (2013.01)

(58) Field of Classification Search
CPC .. G01R 33/288; G01R 33/443; G01R 33/543; G01R 33/583; G01R 33/586
See application file for complete search history.

(56) References Cited

U.S. PATENT DOCUMENTS 6,759,847 B2   7/2004   Brinker
6,762,605 B2   7/2004   Brinker
(Continued)

FOREIGN PATENT DOCUMENTS

EP   1629773 A1   3/2006
JP   2009072571 A   4/2009

OTHER PUBLICATIONS

Wang, Zhangwei et al "Partial-Body SAR Calculations in Magnetic-Resonance Image (MRI) Scanning Systems (Telecommunications Health and Safety)", IEEE Antennas and Propagation Magazine, vol. 54, No. 2, Apr. 2012, pp. 230-237.
(Continued)

*Primary Examiner* — Dixomara Vargas

(57) ABSTRACT

A magnetic resonance system (1) includes at least one radio frequency (RF) transmit coil (6), an RF transmitter (34), an anthropometric unit (28), and an adaptive SAR unit (40). The at least one radio frequency (RF) transmit coil (6) transmits measured RF power to excite and manipulate magnetic resonance in tissues of a subject (57) in an examination region. The RF transmitter (34) controls the amount of transmitted RF power based on a specific absorption rate (SAR) for an imaging sequence. The anthropometric unit (28) determines a mass of a portion of the subject which receives the transmitted RF power based on a determined total mass. The adaptive SAR unit (40) adjusts a selected scan sequence based on the SAR parameters determined from the measured transmitted RF power and a measured reflected power, achieved $|B_1+|$ field, the mass of the portion (Continued)

of the subject which receives the transmitted RF power and applicable SAR parameter models stored in a SAR reference unit (46).

20 Claims, 8 Drawing Sheets

(51) Int. Cl.
  *G01R 33/44* (2006.01)
  *G01R 33/58* (2006.01)

(56) References Cited

U.S. PATENT DOCUMENTS

| | | | |
|---|---|---|---|
| 6,841,999 | B2 | 1/2005 | Arneth |
| 7,187,172 | B2 * | 3/2007 | Bielmeier ............... G01R 33/28 |
| | | | 324/314 |
| 7,385,396 | B2 | 6/2008 | Zhu |
| 7,715,899 | B2 | 5/2010 | Harvey et al. |
| 7,860,551 | B2 | 12/2010 | Sugimoto |
| 2003/0098688 | A1 | 5/2003 | Brinker |
| 2006/0197528 | A1 * | 9/2006 | Bielmeier ............... G01R 33/28 |
| | | | 324/314 |
| 2006/0264737 | A1 | 11/2006 | Faber |
| 2007/0038070 | A1 | 2/2007 | Tank |
| 2010/0134105 | A1 | 6/2010 | Zelinski |
| 2011/0118587 | A1 | 5/2011 | Roemer |
| 2011/0181287 | A1 | 7/2011 | Ito |
| 2011/0263969 | A1 | 10/2011 | Fontius |
| 2012/0226137 | A1 | 9/2012 | Ito |

OTHER PUBLICATIONS

Hebrank, Franz X. "More on SAR—A Practical Guidance for MRI Users", Proceedings of the International Society for Magnetic Resonance in Medicine, vol. 17, Apr. 2009, pp. 1-2.

Homann, H. et al "Toward Individualized SAR Models and in Vivo Validation", Magnetic Resonance in Medicine, vol. 66, No. 6, May 2011, pp. 1767-1776.

Graesslin, I. et al "Patient Adapted SAR Calculation on a Parallel Transmission System", Proceedings of the International Society for Magnetic Resonance in MEDICI8NE, vol. 19, Jan. 2011, pp. 3846.

Stralka, John et al "A Prototype RF Dosimeter for Independent Measurement of the Average Specific Absorption Rate (SAR) during MRI", Journal of Magnetic Resonance Imaging, vol. 26, No. 5, Jan. 2007, pp. 1296-1302.

Wang, Z. et al "Poseable Male and Female Numerical Body Models for Field Calculations in MRI", Proceedings of the International Society for Magnetic Resonance in Medicine, vol. 16, Jan. 2008, pp. 75.

Homann, Hanno "SAR Prediction and SAR Management for Parallel Transmit MRI", 2011.

Homann, Hanno et al "Local SAR Management by RF Shimming: a Simulation Study with Multiple Human Body Models", Magnetic Resonance in Materials PHY. 2011.

Graesslin, Ingmar et al "A Specific Absorption Rate Prediction Concept for Parallel Transmission MR" Magnetic Resonance in Medicine 2012.

\* cited by examiner

| Model case | L-R width (mm) | Gap (mm) | Mass (kg) | Whole body SAR ($W/kg/\mu T^2$) | Partial body SAR ($W/kg/\mu T^2$) (QBC exposed mass) | Local SAR in extremities ($W/kg/\mu T^2$) | Local SAR in trunk ($W/kg/\mu T^2$) |
|---|---|---|---|---|---|---|---|
| Reference | | 60 | 105.8 | 0.35 | 0.61 (57kg) | 3.56 | 3.1 |
| Case 1 | 565 | 60 | 100.9 | 0.36 | .61 (54kg) | 3.43 | 3.01 |
| Case 2 | 640 | 30 | 130.3 | 0.45 | 0.74 (70kg) | 5.96 | 4.43 |
| Case 3 | 660 | 20 | 137.9 | 0.47 | 0.78 (74kg) | 6.85 | 4.82 |
| Case 4 | 680 | 10 | 144.2 | 0.51 | 0.84 (77kg) | 8.1 | 5.45 |
| Case 5 | 715* | 10 | 157.7 | 0.6 | 1.00 (84kg) | 15.33 | 6.21 |
| Case 6 | 715* | 5 | 157.9 | 0.64 | 1.06 (84kg) | 19.2 | 6.29 |
| Case 7 | 715* | 5 | 159.6 | 0.45 | 0.74 (85kg) | 8.6 | 4.38 |
| Case 7 Est. | | | | x = 0.45 | - | 8.81** | 4.41** |
| Case 8 | 690 | 5 | 118.6 | 0.45 | 0.75 (63kg) | 6.47 | 3.74 |
| Case 8 Est. | | | | x = 0.45 | - | 8.81** | 4.41** |
| Case 9 | 715* | 5 | 186.6 | 0.81 | 1.36 (99kg) | 24.81 | 8.47 |

FIGURE 6

ADAPTIVE SPECIFIC ABSORPTION RATE (SAR) CONTROL FOR MAGNETIC RESONANCE IMAGING

CROSS-REFERENCE TO PRIOR APPLICATIONS

This application is the U.S. National Phase application under 35 U.S.C. § 371 of International Application No. PCT/IB2013/058587, filed on Sep. 17, 2013, which claims the benefit of U.S. Provisional Patent Application No. 61/717,164, filed on Oct. 23, 2012. These applications are hereby incorporated by reference herein.

The following relates generally to medical imaging. It finds particular application in conjunction with magnetic resonance examinations and specific absorption rate (SAR), and will be described with particular reference thereto. However, it will be understood that it also finds application in other usage scenarios and is not necessarily limited to the aforementioned application.

Magnetic resonance imaging (MRI) and magnetic resonance spectroscopy (MRS) uses radio frequency (RF) pulses of electromagnetic energy to excite resonance in tissues of a subject. A body also absorbs/dissipates some of the energy of the RF pulses as resistive loss, resulting in tissue heating. For patient safety, limits are set regarding the specific absorption rate (SAR) at which a subject can be allowed to absorb RF power. SAR relates to the time rate at which energy is absorbed per unit mass and is therefore expressed in units of W/kg. The SAR for a given subject during an imaging sequence is typically calculated on a worst-case basis. Most regulations, when a whole body volume transmit coil is utilized, focus on a fixed upper bound based on averaging over an overall patient mass. The averaging in the case of a whole body volume transmit coil results in a figure of whole body average SAR (WB SAR). The mass within the transmit coil volume may vary, is less than to total patient mass in general, and the mass as well as other aspects of the patient will vary patient-to-patient.

With larger imaging bores, larger patients can be imaged, which for nominally the same MR scanning conditions can increase the SAR to which the patient is subjected. The SAR can increase because with the very large patients, more power is used in the RF signals, beyond a proportionate increase with mass, in order to generate the desired $|B_1^+|$ field in a central region or other defined region of the patient. In particular, as patient girth increases the power required increases more than estimated from a proportionate increase in mass, thus whole body average SAR (total absorbed power over total mass) does not remain constant, but increases, with increasing patient girth/mass. Scan parameters can of course be adjusted to reduce the SAR level, with some effect, for example, on examination speeds. The allowed upper SAR level is limited by the regulations (IEC 60601-2-33). As more patient mass is present, more than a proportionate increase in power is used to achieve similar scan parameters; and, when the upper SAR limit is reached the scan parameters are adjusted to bring SAR back into limits before executing the scan. Having a SAR estimator that adapts for patient-to-patient differences is important as body mass and size increases.

One approach to estimating and then limiting the SAR includes utilization of user-entered patient information such as patient mass. However, the mass exposed or affected varies with the amount of patient mass actually subjected to the sensitive region of the RF transmit coil, which in turn depends upon subject/patient position relative to a reference region in the transmit coil such as the central region of the transmit coil. A region of interest in MR imaging for a given patient typically focuses on one anatomical body region such as the head, neck, section of spine, heart, abdomen, shoulder, hand/wrist, knee, or foot/ankle, etc. When a whole body volume transmit coil is used for RF excitation the anatomic region of interest is typically placed in the axial direction at the central region of the transmit coil. This axial position also typically aligns with the imaging isocenter of the MR system. For each such anatomic region positioning there will be a different exposed mass and for a given anatomic region the exposed mass may vary by patient. Some SAR control approaches do not differentiate on these aspects and utilize a worst-case basis. An example for abdominal imaging includes where the abdominal region is centered in a central region of the transmit coil and there are two different positions possible for arms—arms up overhead or arms down at side. For these two positions, the exposed mass and also the extremity local SAR are different, even when one considers the same patient with the abdomen centered. The SAR thus varies in a complicated manner with patient position, a relation to the center of sensitive region of the transmit coil, patient size, and a detailed positioning of extremities for a given subject position. For example, the SAR may become larger as the patient or portions of the patient approach an inside surface or edge of the bore. Typically, an age, mass, gender, and/or patient anatomic region of interest may be entered by a healthcare practitioner prior to scanning, among other patient information. The entered mass in some SAR control methods may be used, in combination with the RF power level used, as the basis for whole body SAR estimation.

In another SAR control method, a relation between the RF $|B_1^+|$ field and the SAR is established and used to estimate for a given set of scan conditions the whole body SAR value. The relation between the $|B_1^+|$ and the SAR may be adjusted according to mass to account for non-linear power-mass effects in a worst-case position. The relation between the $|B_1^+|$ and the SAR may be adjusted for an inferred patient position based upon the type of receive coil in use (e.g., when a head receive coil is identified by the system to be in use then it may be inferred the patient position is head-centered). Also, a local SAR may be estimated if the $|B_1^+|$ (or RF power) and the local SAR relation can be established. However, these approaches do not provide a means to confirm a patient position relative to a transmit coil reference region and/or a patient mass or other patient geometric details, nor do they utilize such confirmed information and measured RF power to establish a patient and patient position specific SAR estimate for one or more of whole body SAR, partial body SAR, Head SAR and local SAR. Where RF Finite Difference Time Domain (FDTD) modeling is used to establish SAR characteristics, the SAR control measures depend on a limited number of anatomical models and would not typically adapt for variations in patients with perhaps the exception of entered patient mass. If certain aspects of a specific patient can be confirmed by the system and the SAR model in the system software is extended to utilize this information, a better SAR estimate may be achieved and would avoid having to use worst-case models that may over-constrain scanning performance.

The following discloses a new and improved adaptive MRI SAR control method and system which addresses the above referenced issues, and others.

In accordance with one aspect, a magnetic resonance system includes at least one radio frequency (RF) transmit coil, an RF transmitter, an anthropometric unit, and an adaptive SAR unit. The at least one radio frequency (RF) transmit coil transmits measured RF power to excite and manipulate magnetic resonance in tissues of a subject in an examination region. The RF transmitter, or the MR system control of the RF transmitter, controls the amount of transmitted RF power based on a specific absorption rate (SAR) for an imaging sequence. The anthropometric unit determines a mass of a portion of the subject which receives the transmitted RF power based on a determined total mass. The adaptive SAR unit adjusts a selected scan sequence based on the SAR determined from the measured transmitted RF power and a measured reflected power, and the mass of the portion of the subject which receives the transmitted RF power. The determined SAR may be one or more of WB SAR, Partial Body SAR, Head SAR or Local SAR.

In accordance with another aspect, a method of magnetic resonance imaging includes measuring transmitted and reflected radio frequency (RF) power that produces a $|B_1^+|$ field by at least one transmit coil achieved in tissues of a subject. A whole body specific absorption rate (SAR) parameter is determined based on the measured transmitted and reflected power, an achieved $|B_1^+|$ field, and a confirmed total mass of the subject. A position, key dimensions and orientation of the subject relative to the at least one transmit coil (6) are identified based on a pilot scan. Applicable SAR estimates (e.g., Local, Head, Partial Body) for an imaging sequence are determined based on the sequence's $B_{1RMS}^2$, the determined whole body SAR parameter, and the identified subject position, key dimensions and orientation. The sequence parameters are adjusted if the determined SAR estimates exceeds allowed limits, until the determined SAR value is within limits. The imaging sequence is performed with the determined SAR estimates after confirming the SAR estimates are within upper limits (or, if not, after adjusting scan parameters).

In accordance with another aspect, a magnetic resonance imaging system includes at least one radio frequency (RF) transmit coil, an RF transmitter, and one or more processors. The at least one radio frequency (RF) transmit coil transmits measured RF power to excite and manipulate magnetic resonance in tissues of a subject in an examination region. The RF transmitter, or the MR system control of the RF transmitter, controls the amount of transmitted RF power based on a specific absorption rate (SAR) for an imaging sequence. The one or more processors are configured to determine a whole body SAR parameter based on the measured transmitted RF power and a measured reflected RF power and anatomical portions of the subject exposed to the transmitted RF power and achieved $|B_1^+|$ field. The one or more processors are further configured to determine applicable SAR parameters and applicable SAR values (e.g., Local, Head, Partial Body) for a selected imaging sequence based on the determined whole body SAR parameter and anatomical portions of the subject exposed during the selected imaging sequence.

One advantage is that one or more determined SAR estimates are based on a measured SAR for a subject.

Another advantage resides in refining the SAR estimates based on different subject configurations and positions.

Another advantage resides in cross checking of entered subject parameters.

Another advantage resides in including subject extremities, fat content, and/or aspect ratio in a SAR determination.

Another advantage is that the SAR estimates are determined based on at least an actual measurement of WB SAR with the patient in the bore in the examination position.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of an adaptive SAR MRI system.

FIG. 2 schematically illustrates another embodiment of the adapted SAR MRI system.

FIG. 6 is an exemplary table of SAR results using model subjects at 3 T/128 MHz for a 3 T whole body transmit coil.

Figure 8:
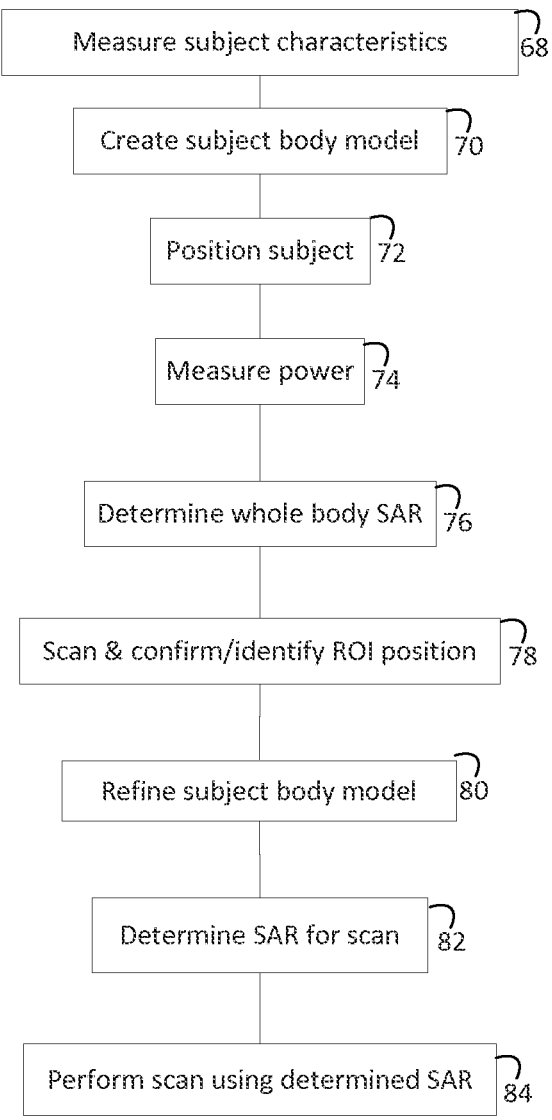

FIG. 8 flowcharts one method of using an embodiment of an adaptive SAR.

Figure 1:
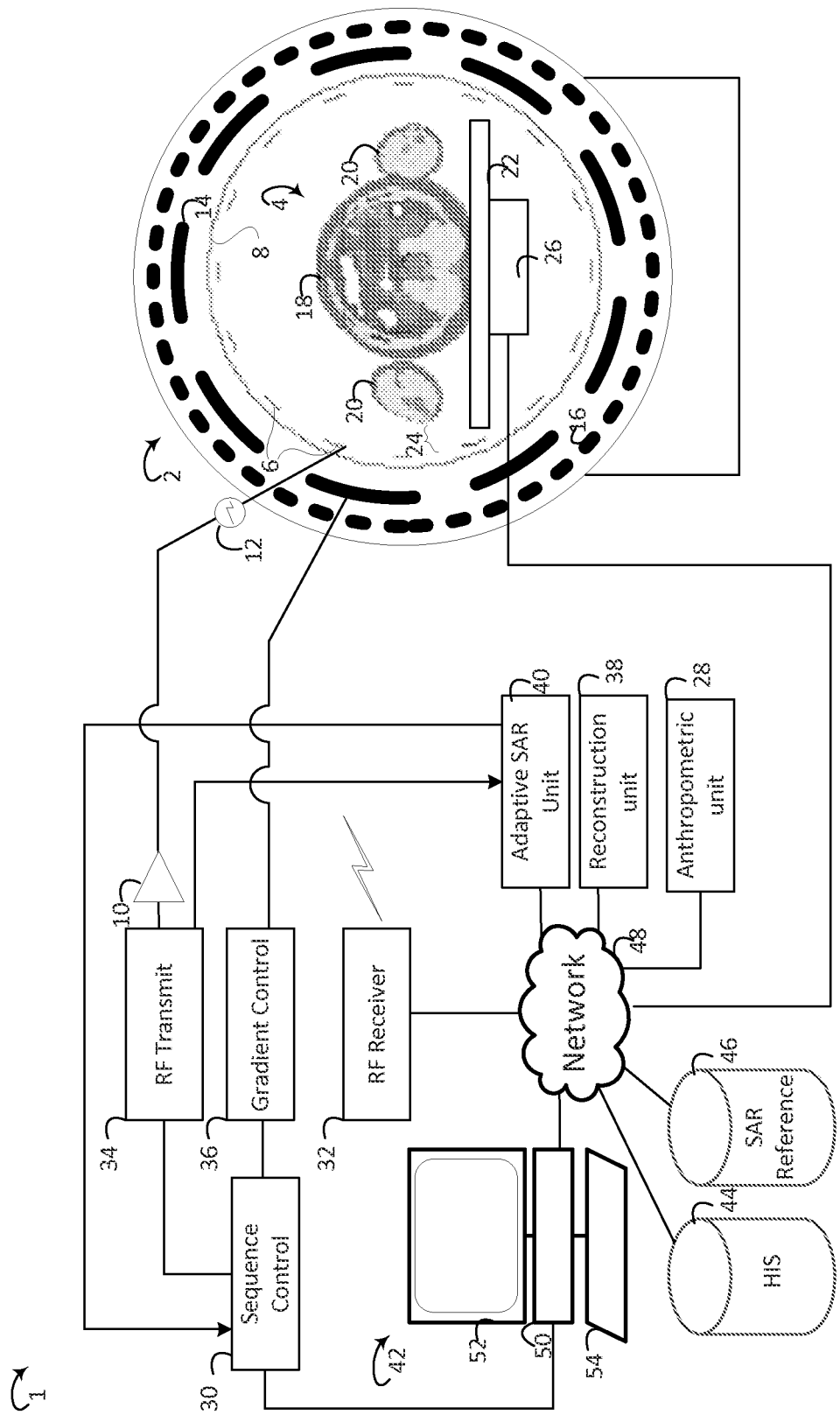

With reference to FIG. 1, an embodiment of an adaptive SAR MRI system 1 is schematically illustrated. The system 1 includes an MRI scanner 2 shown in a cross section with a subject model 4. The scanner 2 includes one or more RF transmit coils 6, and an RF shield 8. The RF transmit coils such as birdcage whole body coils, head or extremity coils, etc., generate RF pulses of electromagnetic $|B_1^+|$ fields to excite and manipulate magnetic resonance in a subject such as the subject model 4. The power transmitted to the RF coils is generally provided by an RF power amplifier 10 and is limited for patient safety. The RF power transmitted by/to the RF transmit coils 6 is measured 12, preferably at a position close to the RF power input to the coils or otherwise remotely at the output of the RF power amplifiers with accounting of a fixed/pre-determined power loss between RF power amplifier and the RF power input of the RF coils 6. Not explicitly shown, it is noted that the power measurement function 12 can communicate with the MR system to provide temporal data for peak forward and average RF power, and reflected RF power, throughout an MR examination. Also, as known in the art, the power measurement function may have programmable preset trip limits for one or more of peak forward, average and reflected RF power. The RF transmit coils can also act in a receive mode to receive a magnetic resonance signal from the subject. The received magnetic resonance signal forms MR data which is used for image reconstruction. The RF shield 8 separates the RF coils from the surrounding gradient coils 14 and main magnet coils 16, providing electromagnetic isolation such that any substantial deleterious interactions between the RF coils 6 and the surrounding gradient coils 14 and main magnet 16 do not occur.

The subject or patient as illustrated by the subject model 4 can be imaged in a body position such as head-first supine abdominal centered, head centered, head-first right lateral decubitus spine centered, feet-first supine knee centered, head or feet first prone breast centered, etc. As noted, the body position is further refined by anatomical segmentation to indicate the axial position of key anatomy such as the chest, head, breast, umbilicus, knee, etc. The subject can also be imaged in a body configuration (e.g., posture) such as with the arms down, arms overhead, etc. In the illustration the body position is a head-first supine position in the axial region of the abdomen centered and the body configuration with the torso or trunk 18 and the extremities 20 or arms in the down configuration. The subject is supported by a subject support 22. The region between the subject and the RF transmit coils is measured as a gap 24. A minimum gap ensures that the subject is not in contact with the RF coils for safety and imaging quality. The gap is defined as a minimum distance including a patient bore dielectric tube and air space between body tissues and coil conductors such as coil rungs and end rings of the whole body coil. The subject can be weighed on a scale 26 which provides a whole body mass measurement. The scale can be integrated with the MR system to transmit the measurement to an anthropometric unit 28 either directly or via network connection. In an alternate embodiment the whole body mass measurement function may rest in the floor of the MR magnet room, or may be a separate non-integrated function within the general MR suite area that can communicate directly or via network with the MR system.

The system 1 includes a sequence control 30 and a RF receiver 32. The sequence controller 30 controls a RF transmit control 34 and the gradient control 36 to perform a selected sequence by transmitting RF and gradient pulses with controlled timing. The RF transmit control 34 controls the power level and timing of the RF pulses delivered to the RF transmit coils 6 and thus controls the applied $|B_1^+|$ fields. The gradient control 36 controls the gradient fields applied to spatially encode, re-focus and manipulate magnetic resonance in the subject. The MR data acquired by the RF coils and/or local receive coils in a receive mode is transmitted to the RF receiver 32. The MR data received by the RF receiver is communicated to a reconstruction unit 38 which reconstructs one or more images.

An adaptive SAR unit 40 computes from a low RF power preparation step the transmitted RF power and reflected RF power and the $|B_1^+|$ field level that is achieved for the net (forward) RF power level. The SAR unit 40 computes the absorbed power for a measured $|B_1^+|$ field=net RF power at the transmit coil*$(1-Q_L/Q_{UL})$, where $Q_L$ is the measured quality factor loaded and is predetermined for the patient mass via a mass-$Q_L$ look up table, or estimated during the preparation step from a RF power-mass look up table for given $|B_1^+|$ field, and $Q_{UL}$ is the measured quality factor unloaded and generally determined once at manufacture for each transmit coil. Alternately, the SAR unit is configured to determine, for the measured $|B_1^+|$ field, a whole body SAR based on the measured transmitted and reflected RF power, and a confirmed patient mass, wherein the confirmed patient mass is based upon a pre-established RF power-$|B_1^+|$-mass relationship or by direct measurement on a MR system interfaced weighing scale and cross-checked against the user entered patient mass. The transmit coil 6 is tuned and matched during manufacture with a 'normal' or most commonly occurring weight of load having no or substantially zero reflective power loss. As mass increases or decreases below this 'normal' level the percent reflected power increases due to impedance mis-match. Measured reflected power may be subtracted from the measured RF power to arrive at a net power to the coil. The unloaded Q-factor $Q_{UL}$ is pre-measured for each coil during manufacture. Q-factor $Q_L$ may be estimated based upon the entered or confirmed patient mass, identified patient position within the transmit coil, and a pre-determined Q-mass relationship from an a priori characterization study.

The whole body SAR can be determined from a ratio of the absorbed power measured for a $|B_1^+|$ field and the subject mass. The subject mass can be a entered subject mass such as via a workstation 42 or retrieved from records of the subject, such as a medical record or hospital information system 44. Importantly, the SAR unit 40 also computes other applicable SAR values from SAR reference 46 based on measured absorbed power, subject position, subject exposed mass and derived whole body SAR value. In this manner, the other applicable SAR values are better estimated than could otherwise be attained from a single model. The SAR reference 46 contains information that relates WB SAR, subject mass/exposed mass and position in the transmit coil to estimated partial body, head and local SAR values. The subject position can be entered by a healthcare practitioner via the workstation 42, or determined from an image reconstruction of the pre-scan using anatomical locations. The subject exposed mass is the mass inside the sensitive volume of the transmit coil/coils. Exposed mass can be estimated from the exposed subject volume inside the sensitive volume of the transmit coil and averaged body tissue densities. Exposed volume is measured from the image reconstruction of the pre-scan. The SAR reference 46 can contain a look-up table stored in memory or a SAR database in other format that relates WB SAR, subject mass/exposed mass and position in the transmit coil to estimated partial body, head and local SAR values. The SAR reference 46 can be pre-constructed from SAR simulations of various human body models and positions inside a transmit coil, and/or from manufacture measurement of whole body SAR and partial body SAR and other SAR values for various sized human subjects when placed in the transmit coil. The whole body SAR can be further refined by the subject configuration. The subject configuration determines the presence or absence of extremities (arms up versus arms down), and the measured gap to the bore surface. The latter may be estimated from pre-pilot, pilot, other data, or images acquired in a preparation step, along with a prior knowledge of the bore dimensions. The SAR unit can select the higher of the determined whole body SAR from SAR reference 46 and the computed whole body SAR from the entered subject mass. The determined whole body and other SAR values can be further refined by other patient characteristics such as body mass index, an aspect ratio, a left-right measurement, an anterior-posterior measurement, and the like.

The workstation 42 connects to a network 48 and to the MRI scanner 2. The network can be wired or wireless, public or private, and/or a combination. The workstation 42 includes an electronic processor or electronic processing device 50, a display 52 which displays the pre-scan information, menus, panels, and user controls, and at least one input device 54 which inputs the healthcare practitioner selections such as subject mass, protocol selection, body position, and the like. The workstation 42 can be a desktop computer, a laptop, a tablet, a mobile computing device, a smartphone, and the like. The input device 54 can be a keyboard, a mouse, a microphone, and the like. The display 52 can include a computer monitor, a television screen, a touch screen, Cathode ray tube (CRT), Storage tube, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), and the like.

The adaptive SAR unit 40, the anthropometric unit 28, and the reconstruction unit 38 are suitably embodied by an electronic data processing device, such as the electronic processor or electronic processing device 50 of the workstation 42, or by a network-based server computer operatively connected with the workstation 42 by the network 48, or so forth. The disclosed SAR determination, model construction, and image reconstruction techniques are suitably implemented using a non-transitory storage medium storing instructions (e.g., software) readable by an electronic data processing device and executable by the electronic data processing device to perform the disclosed SAR determination, SAR measurement and image reconstruction techniques.

Figure 2:
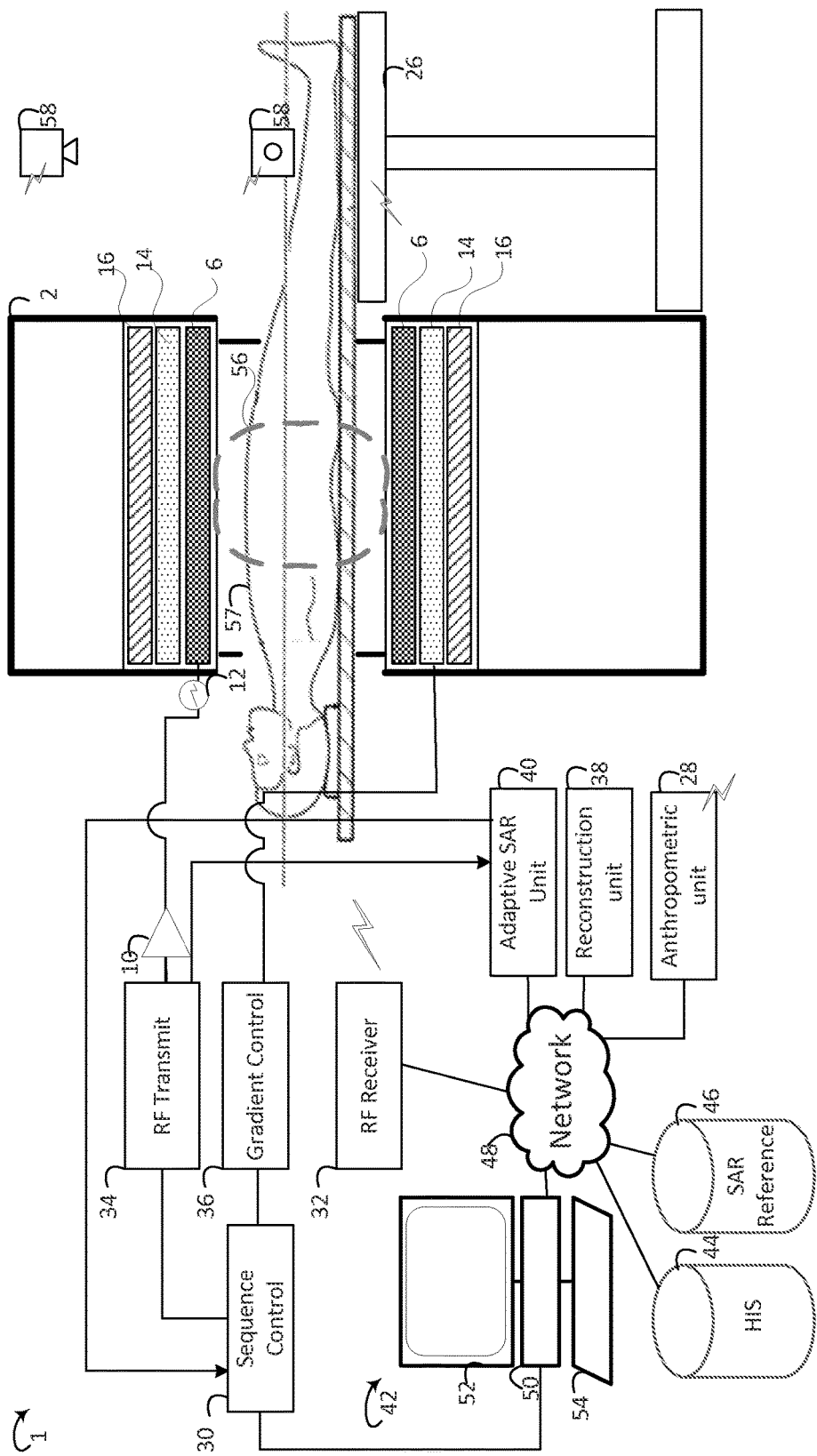

With reference to FIG. 2, another embodiment of the adapted SAR MRI system is schematically illustrated. The MRI scanner 2 is shown in a cross section. A volume 56 subject to the $|B_1^+|$ magnetic field and defined by the characteristics of the transmit coil 6 includes the volume of exposed mass of a subject 57 in an examination volume. The exposed mass of the subject is the portion of the subject that receives the transmitted energy of the transmit coil 6. The exposed mass can be determined by identifying the portion of the subject within the volume based on the patient position which can be determined from one or more cameras 58, or from a pre-pilot or pilot scan. The exposed mass can be computed using the constructed model corresponding to the patient position. The patient position is relative to the center of the transmit coil.

The cameras 58 can also be used to measure other patient characteristics such as height, left-right (L-R) dimensions at several axial positions, anterior-posterior (A-P) dimensions at several axial positions, and the like. Aspect ratios can be calculated from the L-R measurements and the A-P measurements. The model 4 can be constructed from mass and height, and further refined with other characteristics using an elastic fit of a base human body model. Pictures from the cameras and table position and movement can alternatively be used to determine the position of the subject.

The adaptive SAR unit 40 computes the exposed mass in the transmit coil from the anatomy in an established position of the subject in the center of the coil, the constructed 3 dimensional body model, and the effective RF length of the body transmit coil, e.g. the volume 56. For example, with the subject abdomen centered in the transmit coil and the volume or effective length of the transmit coil extending from the shoulders to the mid-thigh, the volume of the subject based on the volume of the model which extends from the shoulders to the mid-thigh is computed from the model. The volume of the model from the shoulders to the mid-thigh relates to the exposed mass, and from the model, a total weight or mass can also be obtained. The adaptive SAR unit can use the computed exposed mass and known characteristics of the transmit coil to determine $Q_{ratio}$. $Q_{ratio}$ is the ratio of the loaded to unloaded Q. $Q_{ratio}$ can be pre-determined and or pre-characterized for a given RF transmit coil based on a Q study.

The adaptive SAR unit 40 computes net power at the transmit coil based on the measured forward power minus the reflected power. The measured power is measured at the transmit coil, or measured at the RF-transmitter 34 with a known loss between the RF-transmitter and the transmit coil 6. The SAR unit 40 accounts for any mismatch losses not measured as reflected power at the RF amplifier, such as measured at the $4^{th}$ port of a hardware quadrature hybrid, in the case of hardware quadrature drive, or at the output side or termination load of an RF circulator/isolator in the path between RF amplifier and transmit coil. The SAR unit computes the subject absorbed power as the net power at the coil*$(1-Q_{ratio})$. From the subject absorbed power, the SAR unit 40 determines the normalized whole body SAR per $\mu T^2$ using the measured $|B_1^+|$ field from a preparation step. For example, whole body SAR per $\mu T^2$=sf*(subject absorbed power/subject total mass/measured $|B_1^+|^2$), where sf is a safety factor ≥1.0.

In one embodiment, the MR system can acquire a rapid set of pilot images using a low WB SAR scan protocol with low $B_{1RMS}^2$ where RMS is root mean square and an initial conservatively established whole body SAR per $\mu T^2$ parameter. The improved whole body SAR per $\mu T^2$ value can be determined by the adaptive SAR unit 40 based on the measured power, $Q_{ratio}$ and attained $|B_1^+|$ field. The anatomic position of the subject 57 relative to the transmit coil can be confirmed and/or identified with the pilot images. The pilot images can also confirm and/or measure the L-R and A-P dimensions and posture (e.g. arms up or down) or other patient characteristics. For example, a water fat pilot image sequence can be used to determine percentage body fat. The model can be constructed and/or refined with the pilot images to estimate mass and obtain position information. The adaptive SAR unit uses the anatomy centered patient position, scan sequence, and model to determine a whole body SAR, a partial body SAR, a head SAR, a local extremity SAR, and/or a local torso SAR per $\mu T^2$ parameters for the subject. If one or more of the SAR values, as obtained by considering $B_{1RMS}^2$ for the sequence and the model based improved SAR per $\mu T^2$ parameters, exceeds the SAR limits, the scan parameters are adjusted by the user until values are within acceptable limits, and the scan is performed using the updated SAR parameters and SAR values.

Figure 3:
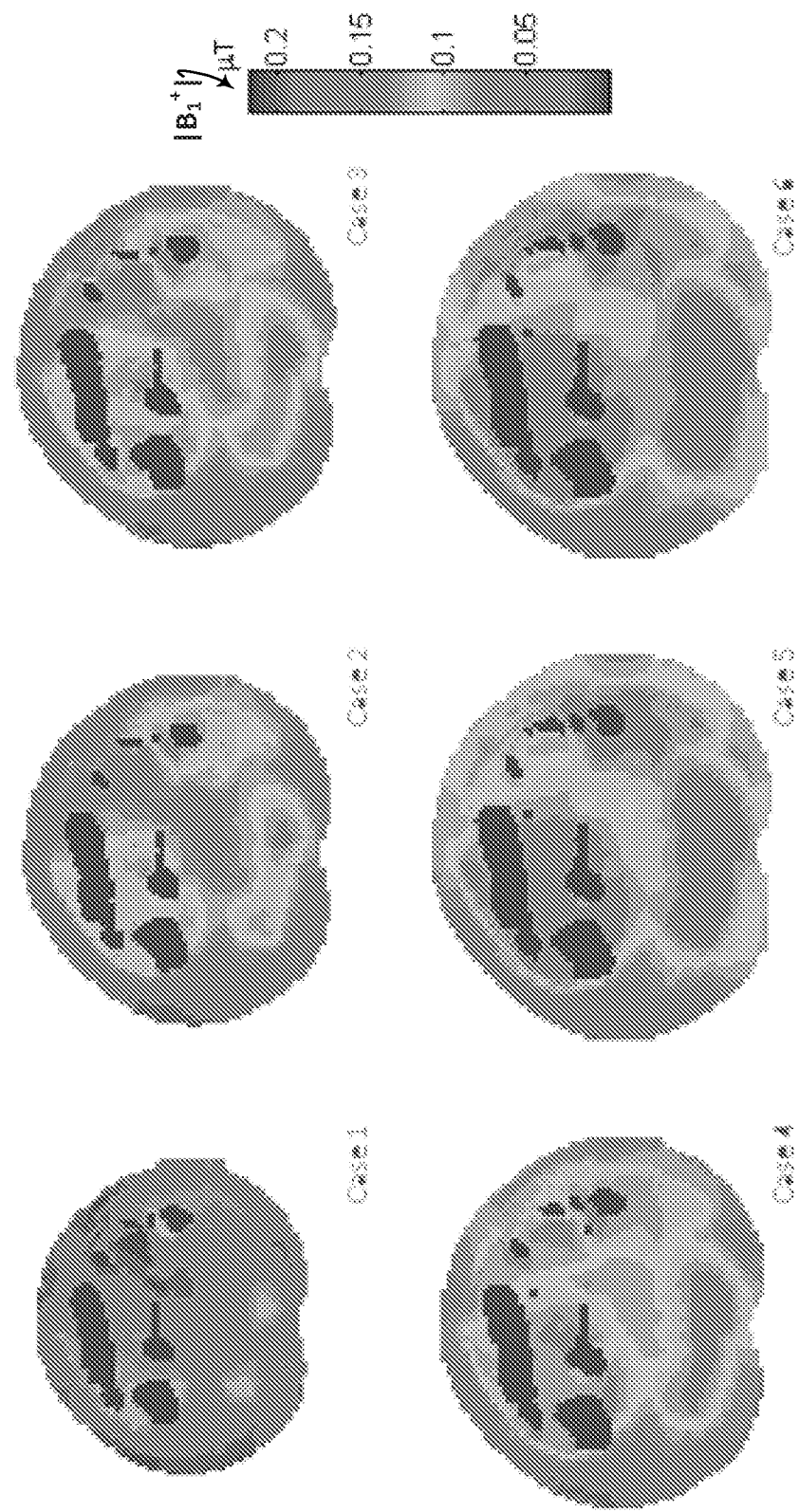
FIG. 3 depicts six exemplary images showing an electromagnetic field ($|B_1^+|$) penetration effect for 3 T/128 MHz with a whole body transmit coil.

FIG. 3 depicts six exemplary images showing an electromagnetic field penetration effect when human body models are studied in a 3.0 T/128 MHz whole body transmit coil. The images are generated from model subjects with increasing amounts of mass and girth. The model subjects are male models with 40 different types of tissues generated using a digital 3D normal mass human male model, and simulated using finite difference time domain (FDTD) methods. Tissue conductivities and permittivities were assigned accordingly. The images include the trunk portion of the model with various tissue types such as a liver, and exclude the extremities. The images show a $|B_1^+|$ field distribution in a center transverse slice of an abdomen. The image intensities are a measure of $|B_1^+|$ in the subject in $\mu T$. All $|B_1^+|$ values are scaled to 1 W of total absorbed RF power by the model subjects.

An average $|B_1^+|$ which reduces with the increase of size or mass can be observed. For example, in the first, lowest mass case 1, the image includes a generally darkened image in comparison with the last, highest mass case 6, which includes a larger area of lighter regions of lower field values. In addition, the $|B_1^+|$ non-uniformity increases with size, but the $|B_1^+|$ distribution patterns otherwise appear similar from image to image. For example, the darkest regions are somewhat consistent from image to image, but the larger uniform lighter region of case 1 differentiates into different lighter regions which increase in area from case 2 to case 6. The average $|B_1^+|$ which reduces with the increase of size or mass, and the non-uniform, but similar distribution $|B_1^+|$ patterns suggest a penetration effect. It is determined from further analysis of these models that when one increase the absorbed power in proportion to the increase in mass that the $|B_1^+|$ field remains progressively lower as mass increases. In other words, for fixed $|B_1^+|$ field the power required increases faster than the mass.

Figure 4:
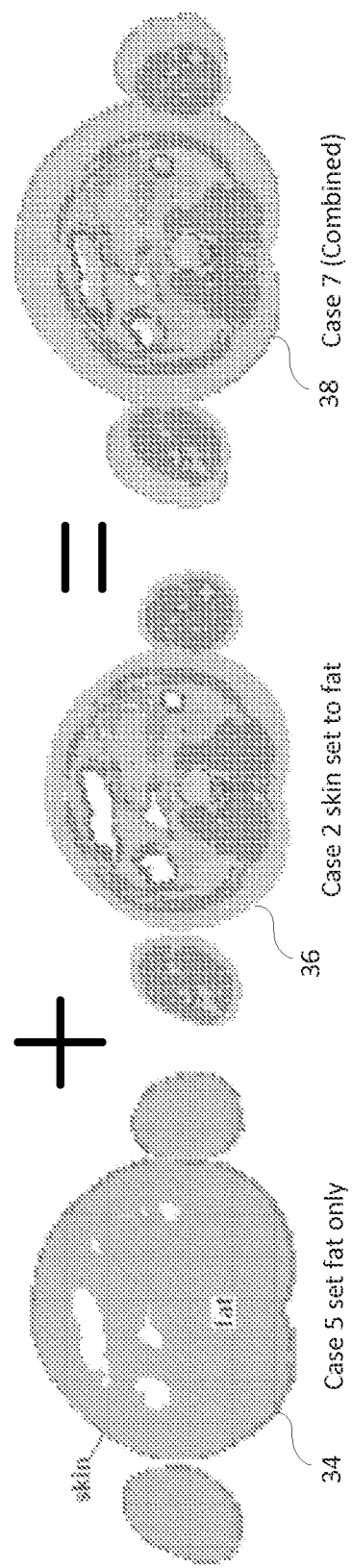
FIG. 4 is an exemplary illustration of model construction for SAR fat analysis.

FIG. 4 is an exemplary illustration of model construction for SAR where fat analysis or fat characteristics of a subject versus a base model is taken into consideration. The volume of the model from case 5 34 is set to fat only and combined with the model of case 2 36 in which the skin tissue is set to appear as fat to produce a model for case 7 38. The weight or overall mass of 159.6 kg for case 7 is similar to case 6 at 157.9 kg. Case 6 represents more muscle and less fat, while case 7 represents less muscle and more fat. The amount of fat in a subject can be entered as a body mass index by the healthcare practitioner, obtained from the subject's medical records, etc. The amount of fat in a subject can alternatively be determined from the pre-scan using a water fat separation sequence and computing a percentage fat based on the reconstructed pre-scan image. The percentage fat included in a subject can be used by the SAR unit to further refine the determined whole body SAR parameter and other SAR parameters. The percentage fat results in different tissue characteristics or type of tissue and that also has an effect on the SAR characteristics.

Figure 5:
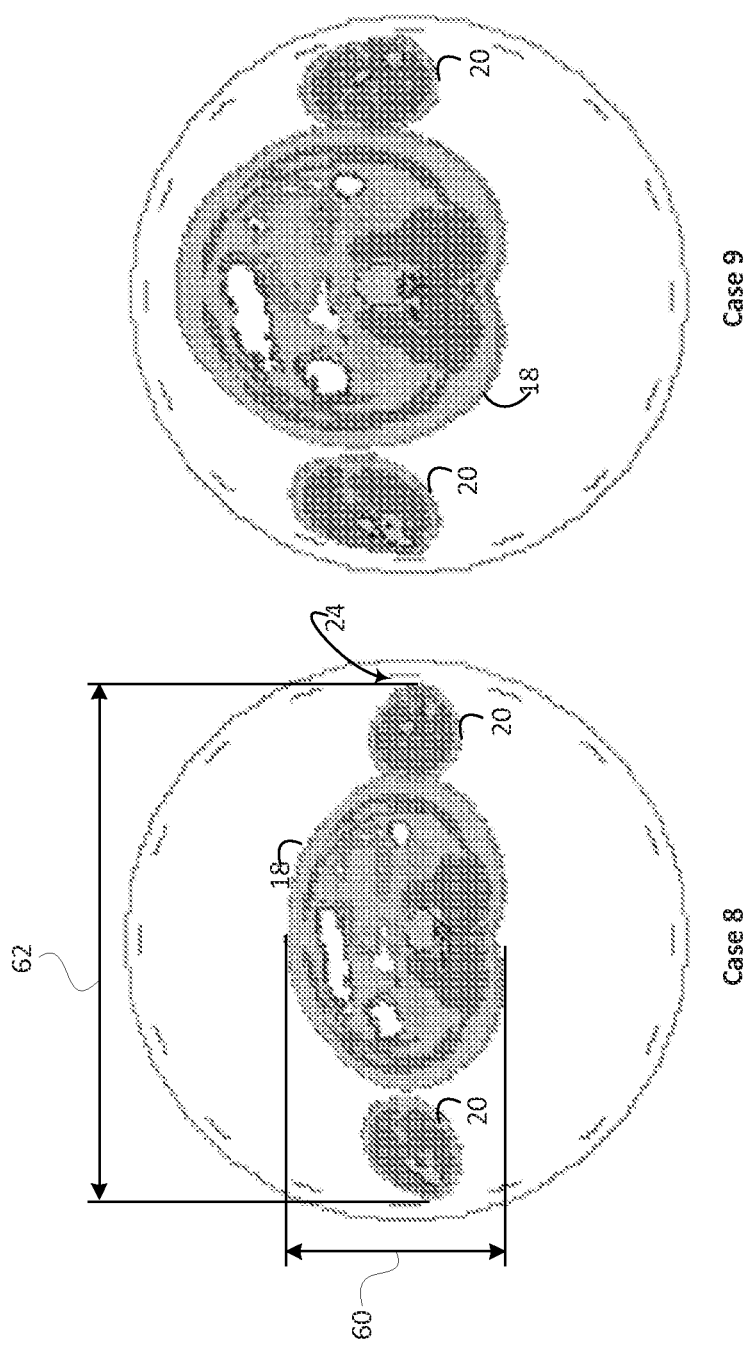
FIG. 5 is an exemplary illustration of model construction for SAR aspect ratio analysis.

FIG. 5 is an exemplary illustration of model construction for SAR aspect ratio analysis. The aspect ratio is defined as the ratio of an anterior-posterior (A-P) height 60 of the trunk 18 to a left-right (L-R) width 62 of the trunk 18 and extremities 20, i.e. arms in a transverse slice. The aspect ratio may also be the ratio of A-P to L-R trunk only dimensions and the presence or not of arms (arms up versus arms down) accounted for separately. The L-R width is a maximum width across all transverse slices. A model subject of case 8 is shown with a narrow (flattish person) aspect of 0.426. A model subject of case 9 is shown with a wide (more rotund) aspect ratio of 0.638. The aspect ratio for the first 5 cases is 0.527, where scaling was done uniformly in those cases. The aspect ratio can be computed from the reconstructed pre-scan (pre-pilot or pilot) images or alternatively entered or from the aforementioned camera based measurements. The model of a case 8 is a 19% reduction in aspect ratio from the first 5 cases. The model of a case 9 is a 21% increase over the aspect ratio of the first 5 cases.

FIG. 6 is an exemplary table of SAR results using model subjects. The table includes the model subject depicted in the images described in reference to FIG. 3, and the model constructions described in reference to FIG. 4 and FIG. 5 and a reference case. The reference case includes a manufactured human body model tested for comparison with case 1. The table includes 9 model subjects, characteristics of each model subject such as the width, gap, and mass, 'measured' SAR based on a mass exposed in the transmit coil, 'measured' SAR in the trunk, 'measured' SAR in the extremities, and a 'measured' whole body SAR. The 'measurements' are performed in a simulation using FDTD methods. The width 62 and the gap 24 can be expressed in millimeters (mm) as described in reference to FIG. 5 and FIG. 1, respectively. The mass of the model subject can be given in kg and includes the overall or total mass for the model subject. The mass represents the entered mass of a subject, or a weighed mass such as by the scale 26. The exposed mass represents a computed mass based on the subject position, e.g. anatomic position and orientation, and extremity locations by the SAR unit for the subject. The whole body SAR parameter=$P_{abs}/m/|B_1^+|_{avg}^2$ in units of W/kg/$\mu T^2$, where $P_{abs}$ is the total absorbed power of human body model with 100% duty cycle, m is the total mass and $|B_1^+|_{avg}$ is the average $|B_1^+|$ over the center transverse slice excluding both arms. The partial body SAR parameter= (average SAR over the transmit coil such as a quadrature body coil exposed mass)/$|B_1^+|_{avg}^2$. The local SAR parameter in extremities=(maximum 10 g-tissue averaged SAR in the arms or legs)/$|B_1^+|_{avg}^2$. The local SAR parameter in trunk=(maximum 10 g-tissue averaged SAR in the trunk including head)/$|B_1^+|_{avg}^2$. A head SAR parameter=(average SAR in the head)/$|B_1^+|_{avg}^2$. In the examples of FIG. 2 to FIG. 5, the head SAR is ignored for the abdomen because the head is outside the transmit coil and experiences very low SAR.

Cases 1 through 6 include model subjects which increase in overall subject mass. The mass increases from 100.9 to 157.9 kg. Images of the observed $|B_1^+|$ field for cases 1-6 are described in reference to FIG. 3. The asterisk in cases 5 and 6 indicated that the models where trimmed to leave a minimum gap between model and coil bore contact surface. Note the difference in the measured SAR in the extremities. Also note in a comparison of case 5 with case 6 that the loading weight is almost the same, but the local SAR in the arms can increase by 25% when gap reduces from 10 mm to 5 mm. In practice a gap of 5 mm is generally not possible as a physical insulating barrier thicker than this is typically used for transmit coils.

Case 7 gives results for a subject model with a weight similar to case 6, but with a different percentage fat. The model constructed for case 7 was described in reference to FIG. 4. For example, in case 7, extra fat is added instead of muscle tissue. The partial body SAR parameter of 0.74 W/kg/$\mu T^2$ for 85 kg is unlike case 6 which is 84 kg, but similar to case 2 which is 70 kg. The higher percentage fat produces a lower SAR per $uT^2$ than the similar mass of case 6. The whole body SAR per $uT^2$ of case 7 is similar to case 2 even though the mass is similar to case 6. Note that the local SAR per $uT^2$ in the extremities or arms is 55% of that observed for case 6. A computed local SAR per $uT^2$ in the extremities and a computed local SAR per $uT^2$ in the trunk are shown separately for each model case.

Cases 8 and 9 give results for different aspect ratios. Case 8 is for a narrow aspect ratio such as 0.426 or −19% of normal shape. Case 9 is for a wide aspect ratio such as 0.638 or +21% of normal shape. The model construction was described in reference to FIG. 5. Note that the partial body SAR per $uT^2$ or measured SAR per $uT^2$ of 0.75 W/kg/$\mu T^2$ for case 8 is similar to case 2 even though the exposed mass of 63 kg is less than 70 kg of case 2. The estimated local SAR per $uT^2$ in the trunk and the extremities shows the computed local SAR per $uT^2$ prior to further refinement based on aspect ratio. The double asterisks for cases 7 and 8 are based on functions described further in FIG. 7.

A multivariate analysis of the modeling results of SAR per $uT^2$ can be represented as a table or series of tables, or a multivariate function $f$, which based on an observed SAR, a whole body SAR can be computed. The variables can include overall mass, height, body position such as anatomical location and orientation, body configuration such as presence or absence of extremities, gap or position relative to transmit coil, tissue type such as percentage body fat, A-P and L-R dimensions, and aspect ratio.

Figure 7:
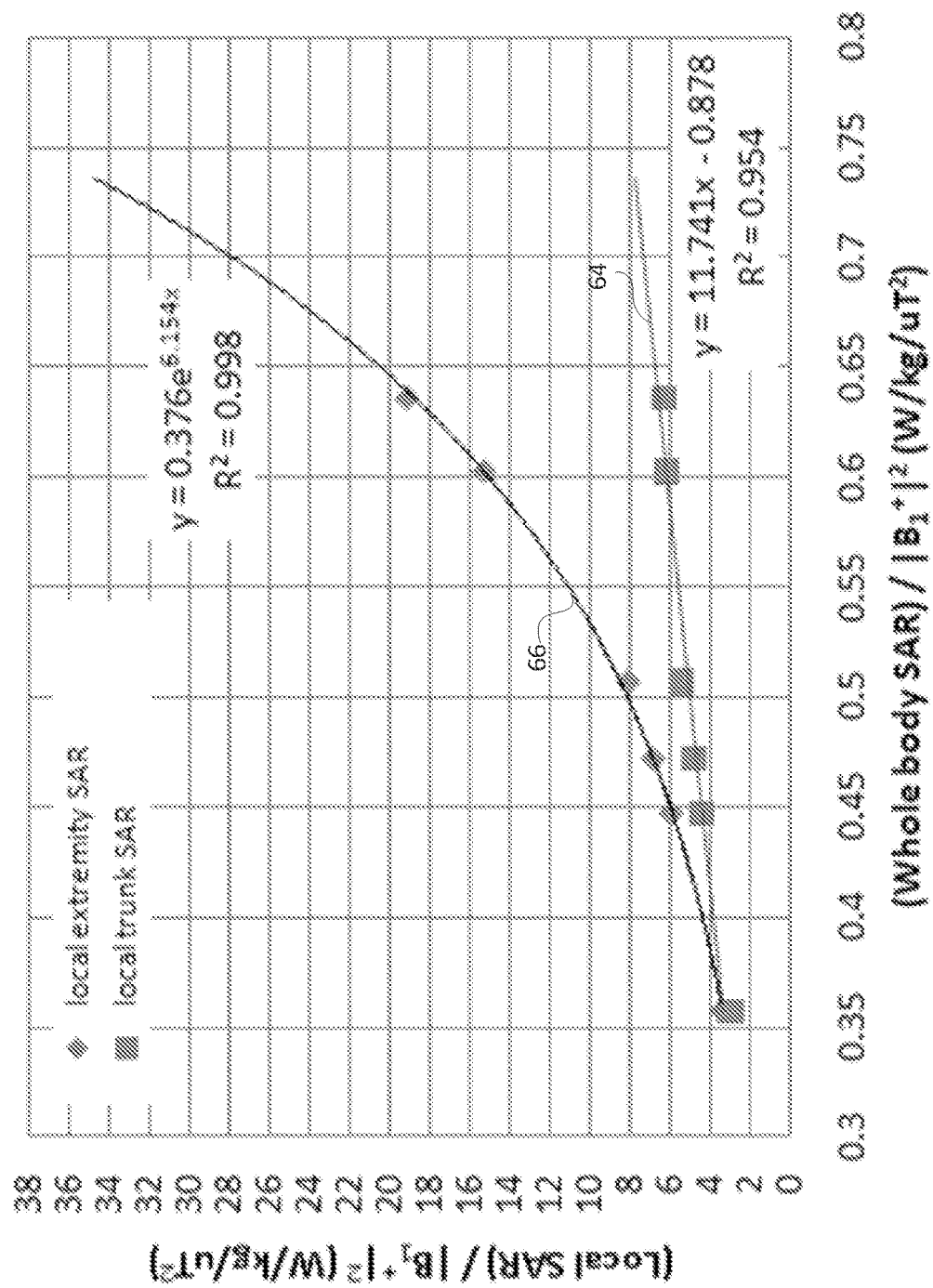
FIG. 7 is an exemplary plot of SAR results for trunk and extremity SAR at 3 T/128 MHz for a 3 T whole body transmit coil.

FIG. 7 is an exemplary plot of SAR results for trunk and extremity local SAR per $uT^2$ versus whole body SAR per $uT^2$. The plot plots the whole body SAR per $uT^2$ on the x-axis and local SAR per $uT^2$ on the y-axis for cases 1-6. The local SAR per $uT^2$ for trunk SAR and extremity SAR per $uT^2$ are plotted separately. Curves are fit to the observed values using a regression analysis. A first curve 64 fit to the trunk values can be expressed as $y_1 = 11.741x - 0.878$, where x is the whole body SAR and $y_1$ is the local trunk SAR. The actual values from FIG. 6 are shown as squares. The $R^2$ value for the line is 0.954. A second curve 66 fit to the observed extremity values is expressed as an exponential function $y_2 = 0.376 e^{6.154x}$, where x is the whole body SAR per $uT^2$ and $y_2$ is the local extremity SAR per $uT^2$. The $R^2=0.998$. The actual values are shown as diamonds. The high $R^2$ values indicate a good fit. The single linear regression models are used to obtain local SAR per $uT^2$ values from the whole body SAR per $uT^2$ values. The trunk SAR per $uT^2$ and the extremity SAR per $uT^2$ are difficult to measure directly. With a whole body SAR per $uT^2$, local SAR per $uT^2$ values are computed by the SAR unit, as applicable for the particular body position. Similar fit functions can be obtained for other body subject position (chest, liver, etc.) or one can extend the model to a multiple linear regression model based on subject position. The fitted functions can be saved in the SAR reference memory 46 as a MRI system parameter file, database, and/or function. The fitted functions provide a complete range for an elastic fit of a model to characteristics of the subject. The subject's body position in z-direction relative to an isocenter of the transmit coil is determined from the pre-scan and the whole body SAR per $uT^2$ is computed. A local SAR per $uT^2$ is determined based on the whole body SAR per $uT^2$. For example, local trunk SAR $(z)=y_1(x)$ and local extremity SAR $(z)=y_2(x)$. The determined values can be used in combination with the scan's $B_{1RMS}^2$ to estimate each of the applicable SAR values in W/kg and to then check against respective SAR limits. Note: A local extremity SAR per $uT^2$ value could be chosen as the larger of twice of local trunk SAR per $uT^2$ and the value from a fit function $y_2$.

FIG. 8 flowcharts one method of using an embodiment of an adaptive SAR estimation method. In a step 68, characteristics of the patient are measured. Measurement of characteristics includes a patient mass such as the total mass measured with the scale 26 which communicates the mass to the anthropometric unit 28. The measured patient characteristics can include the patient height, L-R measurements, A-P measurements, and the like which can be obtained from one more cameras 58 or a low power scan and communicated to the anthropometric unit 28.

In a step 70, the anthropometric unit 28 constructs a 3 dimensional body model of the patient based on the measured characteristics. The body model can include other patient characteristics such as age, gender, and the like which are obtained from the patient records or entered by a healthcare practitioner. The elastic 3 dimensional body model is fit to the patient characteristics. The anthropometric unit 28 associates SAR per $uT^2$ with the model based on functions and prior studies such as shown with reference to FIGS. 6 and 7.

The patient is positioned in the MRI scanner 2 relative to the transmit coils in a step 72. The position can be determined from the cameras 56 and/or a pilot scan. The patient positioning can include placement of local receive coils. The adaptive SAR unit 40 computes the exposed mass in the transmit coil from the patient positioning, the 3 dimensional body model, and the effective RF length of the transmit coil. The SAR unit determines the $Q_{ratio}$ based on the exposed mass and characteristics of the transmit coil such as stored in a table in the SAR reference 46.

Power is measured in a preparation step 74 with the patient positioned. Forward power and reflected power are measured at the transmit coil 6. In a step 76, the whole body SAR per $uT^2$ and whole body SAR for a given pilot scan condition is determined. The whole body SAR is based on the measured forward and reflected power and the exposed mass of the patient based on the fitted body model and a size of an RF field generated by the transmit coil. Net power is computed as forward power less reflected power.

Patient absorbed power is computed as net power times $(1-Q_{ratio})$. Whole body SAR per $uT^2$ is computed as a safety factor*(absorbed power/patient mass/measured $|B_1^+|^2$) where the safety factor is $\geq 1.0$.

Three plane or volume pilot images are acquired in a step 78. The images are reconstructed by the reconstruction unit and are used by the SAR unit to confirm or identify an anatomic position at the center of the transmit coil from anatomic landmarks in the pilot images. The anthropometric unit can use the L-R and A-P dimensions and posture, e.g. arms up or down, to adjust the fitted model in a step 80. If a water fat separation sequence is used with the pilot scans, then the model can be further refined based on the percentage body fat or other patient characteristics identified from the pilot images.

The SAR values are determined for an imaging sequence in a step 82 based on the SAR per $uT^2$ parameters associated with the fitted elastic model corresponding to characteristics of the patient present and for the $B_{1RMS}^2$ of the imaging sequence. The exposed mass is based on the identified patient position, orientation, and posture, and the corresponding volume in the model is that which is subject to the transmitted power. Posture includes the presence or absence of any extremities, e.g. arms above head or arms at the sides. The other applicable SAR values from one or more of partial body SAR, trunk local SAR, the head SAR, and the extremity local SAR are also determined based on the whole body SAR and one or more functions such as describe with reference to FIG. 7, and/or table look-ups such as stored in the SAR reference 46.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising:
at least one radio frequency transmit coil which transmits RF power to excite and manipulate magnetic resonance in tissues of a subject in an examination region;
an RF transmitter which controls the amount of transmitted RF power based on a specific absorption rate (SAR) for an imaging sequence, wherein the imaging sequence comprises the sequence for the excitation and manipulation of magnetic resonance in the subject tissue;
an anthropometric unit which determines a mass of a portion of the subject which receives the transmitted RF power based on a total mass of the subject, by identifying the volume of the mass of the subject exposed in the examination region from a pilot scan;
an adaptive SAR unit which adjusts a selected imaging sequence based on the SAR, wherein the SAR is determined from 1) a difference between the transmitted RF power and a reflected RF power, and 2) the mass of the portion of the subject, wherein the portion receives the transmitted RF power,
wherein the adaptive SAR unit comprises at least an MRI scanner, RF transmit coils, and an RF shield; and
a reconstruction unit which reconstructs images from the pilot scan and determines a position and orientation of the subject based on located landmarks, and
wherein the anthropometric unit determines the portion of the subject which receives the transmitted RF power based on the position and orientation of the subject and characteristics of the at least one transmit coil.

2. The system according to claim 1, wherein the anthropometric unit constructs a 3 dimensional model of a subject based on at least one characteristic of the subject and determines the mass of the portion of the subject which receives the transmitted power based on the model.

3. The system according to claim 2, wherein the at least one characteristic of the subject includes at least one of:
total mass;
height;
age;
gender;
a left-right measurement;
an anterior-posterior measurement;
a ratio of a left-right measurement and an anterior-posterior measurement;
a plurality of tissue types;
a percentage body fat; and
a body mass index.

4. The system according to claim 1, wherein the anthropometric unit determines the total mass of the subject based on a measured mass and verifies the total mass with at least one of an entered mass and a previously stored mass.

5. The system according to claim 1, wherein the adaptive SAR unit determines applicable SAR values from a whole body SAR based on a measured transmitted and reflected RF power and the total mass.

6. The system according to claim 1, wherein the portion of the subject which receives transmitted RF power includes:
an anatomical region; and
a presence or absence of any extremities of the subject.

7. The system according to claim 1, wherein the at least one physical characteristic of the at least one transmit coil includes a length along an axis through an isocenter of the at least one RF transmit coil.

8. The system according to claim 1, wherein the determined SAR includes at least one of:
a partial body SAR;
a local extremity SAR;
a local trunk SAR; and
a head SAR.

9. The system according to claim 8, wherein the at least one physical characteristic of the at least one transmit coil includes a predetermined Qratio from a comparison of a loaded quality value ($Q_L$) and an unloaded quality value ($Q_U$).

10. A non-transitory computer-readable storage medium carrying software which controls one or more electronic data processing devices to perform a method of magnetic resonance imaging, the method comprising:
measuring transmitted and reflected radio frequency power that produces a $|B_1+|$ field in at least a tissue of a subject, wherein the $|B_1+|$ field is produced by at least one transmit coil, and wherein the RF power is transmitted and reflected from the transmit coil;
determining a whole body specific absorption rate (SAR) parameter based on 1) a difference between the measured transmitted and reflected power, divided by 2) $|B_1+|$ field produced in the tissue of a subject, where a quotient of the difference of 1) divided by the field of 2) is further divided by 3) a total mass of the subject;
identifying a position and orientation of the subject relative to the at least one transmit coil based on a pilot magnetic resonance imaging scan;
determining the portion of the subject which receives the transmitted RF power based on the position and orientation of the subject and characteristics of the at least one transmit coil;
determining SAR for an imaging sequence based on the sequence's $B_1$ root mean square ($B_{1RMS}^2$), the determined whole body SAR parameter and the identified subject position and orientation;
adjusting the sequence parameters if the determined SAR exceeds allowed limits, by adjusting until the determined SAR value is within limits;
performing the imaging sequence on the subject with the determined SAR that is adjusted to be within limits, and with the transmit coil.

11. The non-transitory computer-readable storage medium according to claim 10, wherein identifying the position of the subject further includes:
reconstructing pilot images in three planes or as a volume data set; and
locating landmarks in the pilot images to determine the subject position and orientation.

12. The non-transitory computer-readable storage medium according to claim 10, further including:
constructing a 3 dimensional model of the subject which includes pre-determined SAR parameters based on at least one characteristic of the subject; and
refining the whole body SAR parameter based on the constructed model.

13. The non-transitory computer-readable storage medium according to claim 12, wherein the total mass of the subject is measured and verified with at least one of an entered amount and a previously stored amount.

14. The non-transitory computer-readable storage medium according to claim 10, wherein the tissues of the subject includes:
   an anatomical region; and
   a presence or absence of any extremities of the subject.

15. The non-transitory computer-readable storage medium according to claim 10, wherein the at least one characteristic of the subject includes at least one of:
   total mass;
   height;
   age;
   gender;
   a left-right measurement;
   an anterior-posterior measurement;
   a ratio of a left-right measurement and an anterior-posterior measurement;
   a plurality of tissue types;
   a percentage body fat; and
   a body mass index.

16. The non-transitory computer-readable storage medium according to claim 10, wherein the determined SAR includes at least one of:
   a partial body SAR;
   a local extremity SAR;
   a local trunk SAR; and
   a head SAR.

17. A magnetic resonance imaging system, comprising:
   at least one radio frequency transmit coil which transmits RF power to excite and manipulate magnetic resonance in tissues of a subject in an examination region;
   an RF transmitter which controls the amount of transmitted RF power based on a specific absorption rate (SAR) for an imaging sequence;
   an anthropometric unit which determines a mass of a portion of the subject which receives the transmitted RF power based on a total mass of the subject, by identifying the volume of the mass of the subject exposed in the examination region from a pilot scan;
   one or more processors each configured to:
   determine a whole body SAR parameter based on a ratio between 1) a difference between the transmitted RF power and a reflected RF power, and 2) a mass of the anatomical portions of the subject exposed to the transmitted RF power and achieved $|B_1+|$ field; and
   determine SAR parameters and applicable SAR values for a selected imaging sequence, wherein the SAR parameters and applicable SAR values are determined based on a ratio between 1) the determined whole body SAR parameter and 2) a mass of the anatomical portions of the subject exposed to the transmitted RF power during the selected imaging sequence,
   wherein applicable SAR values are applicable for the exposed anatomical portions,
   a reconstruction unit which reconstructs images from the pilot scan and determines a position and orientation of the subject based on located landmarks, and
   wherein the anthropometric unit determines the portion of the subject which receives the transmitted RF power based on the position and orientation of the subject and characteristics of the at least one transmit coil.

18. The system according to claim 17, wherein the anthropometric unit constructs a 3 dimensional model of a subject based on at least one characteristic of the subject and determines the mass of the portion of the subject which receives the transmitted power based on the model.

19. The system according to claim 17, wherein the anthropometric unit determines the total mass of the subject based on a measured mass and verifies the total mass with at least one of an entered mass and a previously stored mass.

20. The system according to claim 17, wherein characteristics of the at least one transmit coil includes a predetermined Qratio from a comparison of a loaded quality value ($Q_L$) and an unloaded quality value ($Q_U$).

* * * * *